United States Patent
Jung et al.

(10) Patent No.: US 8,891,263 B2
(45) Date of Patent: Nov. 18, 2014

(54) INVERTER APPARATUS HAVING POWER SUPPLY CIRCUIT

(71) Applicant: Korea Electronics Technology Institute, Seongnam-si (KR)

(72) Inventors: Insoung Jung, Seoul (KR); Junhyuk Choi, Seoul (KR); Bon Gwan Gu, Bucheon-si (KR); Joonsung Park, Seoul (KR); Jinhong Kim, Suwon-si (KR)

(73) Assignee: Korea Electronics Technology Institute, Seongnam-Si, Gyeonggi-Do (KR)

( * ) Notice: Subject to any disclaimer, the term of this patent is extended or adjusted under 35 U.S.C. 154(b) by 187 days.

(21) Appl. No.: 13/712,550

(22) Filed: Dec. 12, 2012

(65) Prior Publication Data
US 2013/0163294 A1 Jun. 27, 2013

(30) Foreign Application Priority Data

Dec. 27, 2011 (KR) .................. 10-2011-0143363

(51) Int. Cl.
| H02M 5/44 | (2006.01) |
|---|---|
| H02M 7/5387 | (2007.01) |
| H02M 1/08 | (2006.01) |
| H03K 17/567 | (2006.01) |
| H02M 5/453 | (2006.01) |
| H02M 1/00 | (2006.01) |

(52) U.S. Cl.
CPC ........ *H02M 1/08* (2013.01); *H02M 2001/0009* (2013.01); *H03K 2217/0027* (2013.01); *H02M 7/5387* (2013.01); *H03K 2217/0081* (2013.01); *H03K 17/567* (2013.01)
USPC ............................. 363/51; 363/35

(58) Field of Classification Search
USPC .................... 363/34, 35, 37, 50, 51
See application file for complete search history.

(56) References Cited

U.S. PATENT DOCUMENTS

| 5,465,202 | A * | 11/1995 | Ibori et al. ..................... 363/37 |
|---|---|---|---|
| 6,204,627 | B1 * | 3/2001 | Watanabe et al. ............. 318/729 |
| 6,556,459 | B2 * | 4/2003 | Okui et al. ..................... 363/37 |
| 7,084,601 | B2 | 8/2006 | Maeda et al. |
| 7,336,052 | B2 * | 2/2008 | Grbovic ....................... 318/800 |
| 7,742,321 | B2 | 6/2010 | Komulainen et al. |
| 8,154,890 | B2 * | 4/2012 | Yasuda et al. .................. 363/34 |
| 2003/0090241 | A1 | 5/2003 | Nakatsu et al. |

OTHER PUBLICATIONS

S.A Molepo et al., "A Flying Capacitor Multilevel Inverter with Bootstrap-powered MOSFET Gate Drive Circuits", IEEE, 2002, pp. 701-705.

(Continued)

*Primary Examiner* — Gary L Laxton
(74) *Attorney, Agent, or Firm* — Lowe Hauptman & Ham, LLP

(57) ABSTRACT

An inverter apparatus having a power supply circuit includes a converter circuit for rectifying AC power into DC power, a smoothening circuit for smoothening the rectified DC power, an inverter circuit for converting the smoothened DC into AC at a variable frequency through a plurality of switches to control a load, and a current detection circuit for detecting overcurrent from the smoothened DC supplied from the inverter circuit, wherein the inverter circuit applies bootstrap power for driving the switches to the current detection circuit to use the bootstrap power as power of the current detection circuit. When bootstrap power for driving switch gates is used, it is possible to use the bootstrap power as the power of the current detection circuit by adding the auxiliary circuit composed of a small number of passive elements.

8 Claims, 4 Drawing Sheets

(56) References Cited

OTHER PUBLICATIONS

Korean Notice of Allowance for application No. 10-2011-0143363 dated Jun. 10, 2013.

Korean Office Action for application No. 10-2011-0143363 dated Feb. 25, 2013.

* cited by examiner

INVERTER APPARATUS HAVING POWER SUPPLY CIRCUIT

CROSS REFERENCE TO RELATED APPLICATION

This application claims the priority of Korean Patent Application No. 10-2011-0143363 filed on Dec. 27, 2011 in the KIPO (Korean Intellectual Property Office), which is incorporated herein by reference in its entirety.

TECHNICAL FIELD

The present invention relates to an inverter apparatus and, more particularly, to an auxiliary power supply circuit that supplies power to a current detection circuit of an inverter.

BACKGROUND ART

To achieve inexpensive small-capacity inverter, only current of two phases of three phases of an inverter is fed back and used for control and shoot-through or output short-circuit generated during operation of the inverter is detected through overcurrent using a resistor for detecting negative voltage (DCN) of DC link voltage or a resistor for detecting positive voltage (DCP) of the DC link voltage to stop the operation of the inverter.

A method using a DCN detection resistor can be implemented through a simple overcurrent detection circuit without an additional power supply since the overcurrent detection circuit has the same potential as the ground of a controller. The method using a DCN detection resistor is widely used because of the above-mentioned advantage. However, when grounding occurs in a phase that does not correspond to a current sensor from among output three phases in a circuit configuration using only two current sensors, the grounding cannot be detected, damaging the inverter.

A DCP detection scheme can detect and prevent all overcurrent situations such as shoot-through, output short-circuit, output grounding, etc. since a current detection resistor is located at DCP of DC link voltage. However, the DCP detection scheme requires an additional tap power of an insulating transformer for driving an IC of a detection circuit because the detection circuit is located at DCP of the DC link voltage. That is, in the conventional DCP overcurrent detection scheme for an inverter, a transformer tap generates power for driving an overcurrent detection circuit, to result in an increase in the volume of the transformer. This increases cost and system size of a small-capacity inverter.

DETAILED DESCRIPTION OF THE INVENTION

Technical Problems

An object of the present invention is to provide an inverter apparatus that supplies power for driving an overcurrent detection circuit thereof through an internal auxiliary circuit instead of a separate transformer tap.

Technical Solutions

According to one aspect of the present invention, an inverter apparatus includes a converter circuit for rectifying AC power into DC power, a smoothening circuit for smoothening the rectified DC power, an inverter circuit for converting the smoothened DC into AC at a variable frequency through a plurality of switches to control a load, and a current detection circuit for detecting overcurrent from the smoothened DC supplied from the inverter circuit, wherein the inverter circuit applies bootstrap power for driving the switches to the current detection circuit to use the bootstrap power as power of the current detection circuit.

The inverter circuit may include a switching circuit using the bootstrap power as power for turning on gates of the switches, and an auxiliary circuit for applying the bootstrap power from the switching circuit to the current detection circuit.

The auxiliary circuit may include a diode and a resistor serially connected to the switching circuit, and a capacitor connected in parallel with the serially connected diode and resistor.

The current detection circuit may detect positive voltage of DC link voltage from the smoothened DC applied to the inverter circuit.

According to another aspect of the present invention, an inverter apparatus having a current detection circuit for detecting current from smoothened DC applied to an inverter circuit includes a plurality of switches for converting the smoothened DC into AC at a variable frequency to control a load, bootstrap power for driving the switches, a switching circuit using the bootstrap power as power for turning on gates of the switches, and an auxiliary circuit for applying the bootstrap power from the switching circuit to the current detection circuit.

The auxiliary circuit may include a diode and a resistor serially connected to the switching circuit, and a capacitor connected in parallel with the serially connected diode and resistor.

The switching circuit may include a diode and a resistor serially connected to the auxiliary circuit, and a capacitor connected in parallel with the diode and the resistor serially connected to the auxiliary circuit.

The current detection circuit may measure positive voltage of DC link voltage from the smoothened DC applied to the inverter circuit to detect overcurrent.

Advantageous Effects

While an additional power supply is needed when the method of detecting the positive voltage of DC link voltage is used to detect overcurrent of an inverter, as described above, the present invention can provide power without using an additional power supply by adding an auxiliary circuit such that bootstrap power can be used without using an additional switching mode power supply (SMPS) for the method of detecting the positive voltage of DC link voltage. That is, although the conventional DCP overcurrent detection method increases the volume of a transformer because a transformer tap generates power for driving the overcurrent detection circuit, the present invention can supply power to the overcurrent detection circuit through an auxiliary power circuit using bootstrap power for driving a gate. Accordingly, it is possible to achieve a small overcurrent detection circuit of the inverter apparatus, decreasing production cost.

DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings.

MODE FOR CARRYING OUT THE INVENTION

Figure 1:
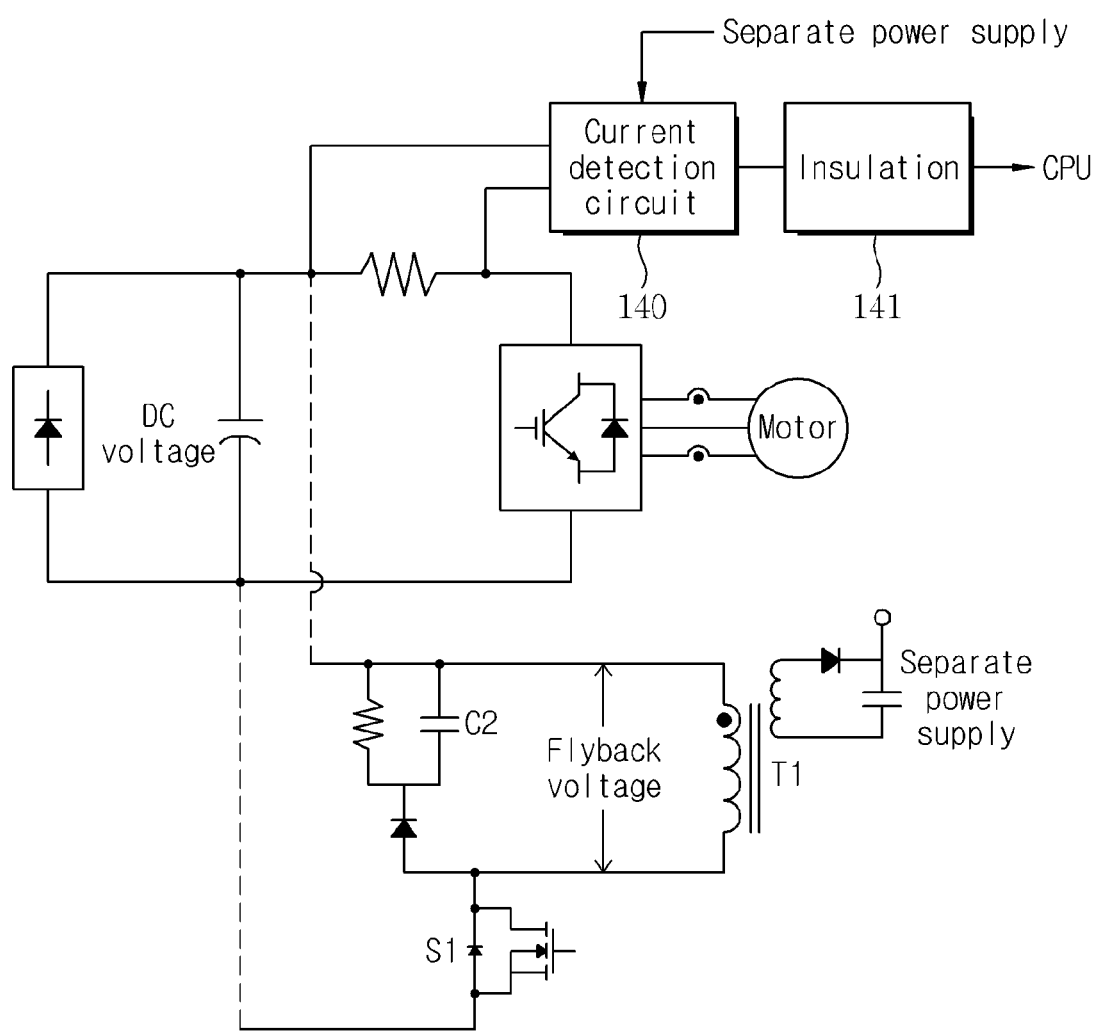
FIG. 1 illustrates a conventional inverter apparatus including a current detection circuit.

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it may obscure the subject matter of the present invention. The preferred embodiments described in the specification and shown in the drawings are illustrative only and are not intended to represent all aspects of the invention, such that various equivalents and modifications can be made without departing from the spirit of the invention.

FIG. 1 illustrates a conventional inverter apparatus including a current detection circuit.

As shown in FIG. 1, an SMPS circuit for an additional transformer tap power supply for driving an overcurrent detection resistor and an overcurrent detection circuit is provided to DCP of the inverter apparatus. This circuit configuration increases the size of the inverter apparatus.

To reduce the size of the inverter apparatus, the present invention generates power necessary for a DCP current detection circuit through an auxiliary circuit composed of a small number of passive elements. Accordingly, the power can be supplied to the current detection circuit without an additional SMPS. A description will be given of an inverter apparatus according to an embodiment of the present invention.

Figure 2:
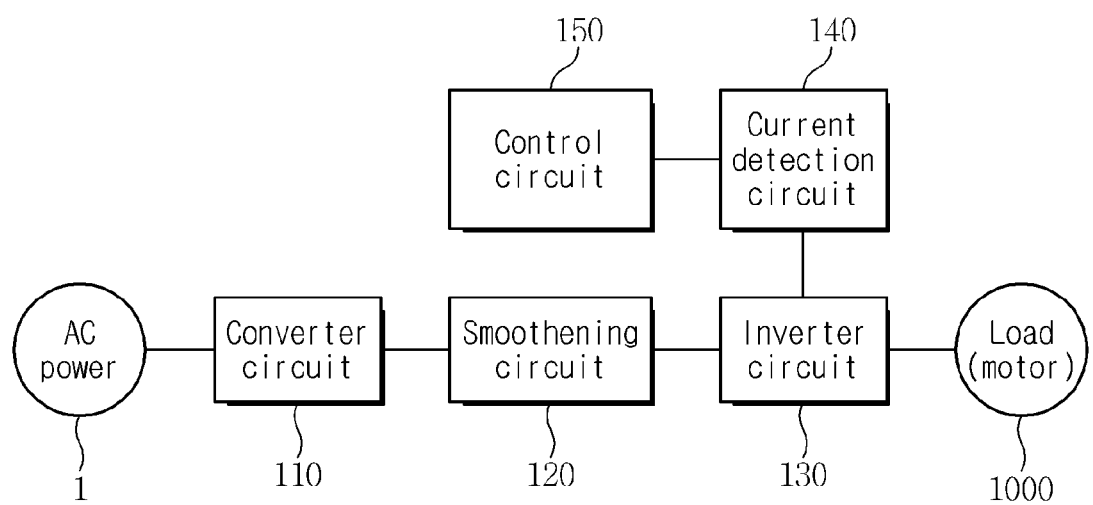
FIG. 2 is a block diagram of an inverter apparatus according to an embodiment of the present invention.

FIG. 2 is a block diagram of the inverter apparatus according to an embodiment of the present invention.

Referring to FIG. 2, an inverter 100 is provided with AC power from an AC power supply 1 to control a load (motor) 1000. The inverter 100 includes a converter circuit 110 for rectifying the AC power into DC power, a smoothing circuit 120 performing smoothening for reducing ripples included in the DC power to output smoothened DC voltage, an inverter circuit 130 for converting the smoothened DC voltage into AC voltage at a variable frequency using a plurality of switch circuits, a current detection circuit 140 for detecting current applied to the inverter circuit 130, and a control circuit 150 for controlling the components of the inverter 100.

More specifically, the converter circuit 110 receives AC power (commercial power), rectifies the AC power and outputs DC voltage. The converter circuit 110 preferably uses a plurality of diodes. A diode flows current depending on a direction in which a voltage is applied to the diode. A voltage can be applied to the output port of the diode in the same direction all the time using this property of the diode. Accordingly, the converter circuit 110 can convert AC into DC using diodes. Conversion of AC into DC is called rectification. In the case of three-phase AC input, the converter circuit 110 can full-wave-rectify AC power using a combination of six diodes. The output of the converter circuit 110 is applied to the smoothening circuit 120.

The smoothening circuit 120 preferably includes a smoothening capacitor. The smoothening circuit 120 reduces ripples included in the rectified DC voltage through the smoothening capacitor to output smoothened DC voltage.

An inrush current suppressing circuit may be included between the converter circuit 110 and the smoothing circuit 120. The inrush current suppressing circuit is described. The smoothening capacitor include in the smoothening circuit 120 accumulates electricity. In the instant of application of a voltage to the smoothening capacitor, inrush current may flow to charge the smoothening capacitor. To prevent rectifying diodes from being damaged due to the inrush current, it is possible to construct a circuit in which a resistor is forcibly connected in series for a predetermined time (about 0.5 seconds) from when power is supplied to suppress inrush current, and then both terminals of the resistor are short-circuited using a relay such that current is diverted from the resistor.

The inverter circuit 130 generates AC from DC. To achieve this, the inverter circuit 130 includes a plurality of switches (switch circuits). Provided that the output of the inverter circuit 130 is single phase AC and four switches S1 to S4 are used, when a pair of the first and fourth switches and a pair of the second and third switches S2 and S3 are alternately turned on/off for DC power applied through the smoothening circuit 120, AC flows through the load 1000. That is, when the first and fourth switches S1 and S4 are turned on, current flows through the load 1000 in one direction. When the second and third switches S2 and S3 are turned on, current flows in the other direction. When this operation is repeated at predetermined intervals, AC flows through the load 1000. The frequency of the AC is changed by changing on/off time of the four switches S1 to S4. For example, when an operation of turning on the first and fourth switches S1 and S4 for 0.5 seconds and turning on the second and third switches S2 and S3 for 0.5 seconds is repeated, AC reversed once per second, that is, AC at a frequency of 1 Hz flows. The voltage increases when ON time increases and decreases when ON time decreases. This control method is called PWM (Pulse Width Modulation) because the voltage is controlled using a pulse width. In the embodiment of the present invention, it is assumed that the inverter circuit 130 outputs three-phase AC. To obtain three-phase AC, first to sixth switches S1 to S6 are used. Accordingly, the inverter circuit 130 turns on/off the six switches at a predetermined time and interval. It is possible to control the load 1000, that is, motor, at the predetermined time and interval. Particularly, the inverter circuit 130 according to the embodiment of the present invention includes bootstrap power for driving the switches. The switches of the inverter circuit 130 may be implemented as transistors. For example, the switches can use an IGBT (Insulated Gate Bipolar Transistor). The bootstrap power supplies a turn-on voltage to gates of transistors. The inverter circuit 130 provides power of the current detection circuit 140 using the above-mentioned switch turn-on voltage. This circuit configuration will now be described in detail.

The current detection circuit 140 measures DC voltage (DC link voltage) applied to the inverter circuit 130. That is, the current detection circuit 140 detects current. Particularly, the current detection circuit 140 can measure and detect positive voltage (DCP) of the DC link voltage. For example, the current detection circuit 140 can compare a voltage obtained by distributing the DC link voltage using two resistors with reference values of a low voltage and an over-voltage through a comparator, and then output final detection signals, low voltage (LV) and over-voltage (OVT) signals through a photocoupler in order to insulate the DC link voltage and control power from each other.

The control circuit 150 controls the above-mentioned converter circuit 110, the smoothening circuit 120, the inverter circuit 130 and the current detection circuit 140. Particularly, the control circuit 150 controls the inverter circuit 130. The control circuit 150 may be a CPU.

Figure 3:
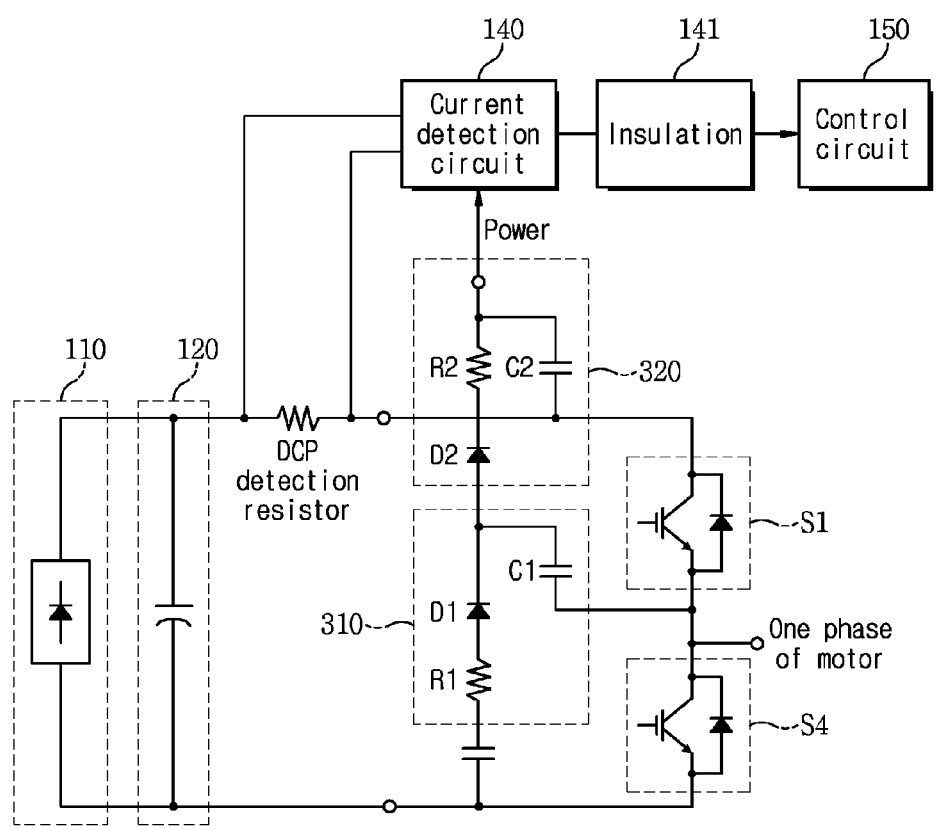
FIGS. 3 and 4 are views for explaining the inverter apparatus according to the embodiment of the present invention.
Figure 4:
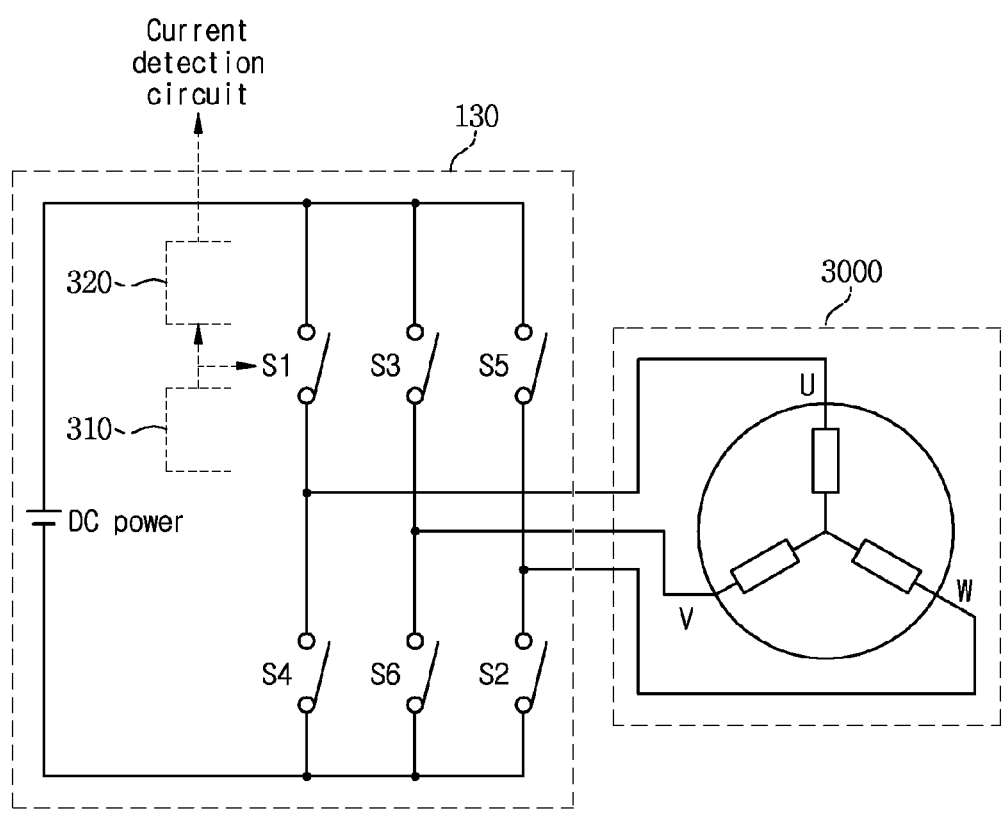

FIGS. 3 and 4 are views for explaining the inverter apparatus according to the embodiment of the present invention.

While FIG. 3 shows that the converter circuit 110 includes only one diode, the converter circuit 110 can include a plurality of diodes. In the case of three-phase AC input, the converter circuit 110 preferably full-wave-rectifies three-phase AC using a combination of six diodes. The smoothening circuit 120 includes a smoothening capacitor. An inrush current suppressing circuit may be selectively included between the converter circuit 110 and the smoothening circuit 120.

AC power is applied as DC power to the inverter circuit 130 through the converter circuit 110 and the smoothening circuit 120. The inverter circuit 130 basically includes a plurality of switches. FIG. 4 shows that input from the converter circuit 110 and the smoothening circuit 120 is simplified as DC power. FIG. 4 shows first to sixth switches S1 to S6 for obtaining three-phase AC on the assumption that the inverter circuit 130 outputs three-phase AC. The inverter circuit 130 turns on/off the six switches S1 to S6 at a predetermined time and interval. The load 1000, that is, motor can be controlled at the predetermined time and interval. FIG. 3 shows only output of one phase of the motor, that is, load 1000 and first to fourth switches S1 to S4.

The inverter circuit 130 includes bootstrap power for driving the plurality of switches S1 to S6. The switches S1 to S6 can use transistors. To turn on/off the transistors at a predetermined time and interval, the inverter circuit 130 includes a switching circuit 310 for charging and discharging a voltage for turning on gates of the switches through the bootstrap power. As shown in FIG. 3, the switching circuit 310 includes a first resistor R1, a first diode D1, which are serially connected, and a first capacitor C1 connected in parallel with the first resistor R1 and the first diode D1. Reference numeral 320 represents an auxiliary circuit. In this manner, the inverter circuit 130 includes the auxiliary circuit 320. The auxiliary circuit 320 supplies bootstrap power to the current detection circuit 140 through the switching circuit 320. As shown in FIG. 3, the auxiliary circuit 320 includes a second diode D2, a second resistor R2, which are serially connected, and a second capacitor C2 connected in parallel with the second diode D2 and the second resistor R2. According to the auxiliary circuit 320, the bootstrap power can be used as power of the current detection circuit.

While an additional power supply is needed when the method of detecting the positive voltage of DC link voltage is used to detect overcurrent of an inverter, as described above, the present invention can provide power without using an additional power supply by adding an auxiliary circuit such that bootstrap power can be used without using an additional switching mode power supply (SMPS) for the method of detecting the positive voltage of DC link voltage. That is, although the conventional DCP overcurrent detection method increases the volume of a transformer because a transformer tap generates power for driving the overcurrent detection circuit, the present invention can supply power to the overcurrent detection circuit through an auxiliary power circuit using bootstrap power for driving gates. Accordingly, it is possible to achieve a small overcurrent detection circuit of the inverter apparatus, decreasing production cost. Particularly, when bootstrap power for driving switch gates is used, it is possible to use the bootstrap power as the power of the current detection circuit by adding the auxiliary circuit composed of a small number of passive elements. Accordingly, the size of the inverter overcurrent detection circuit can be reduced and production cost can be decreased.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Therefore, the present invention intends not to limit the embodiments disclosed herein but to give a broadest range matching the principles and new features disclosed herein. It is obvious to those skilled in the art that claims that are not explicitly cited in each other in the appended claims may be presented in combination as an embodiment of the present invention or included as a new claim by a subsequent amendment after the application is filed.

What is claimed is:

1. An inverter apparatus comprising:
a converter circuit for rectifying AC power into DC power;
a smoothening circuit for smoothening the rectified DC power;
an inverter circuit for converting the smoothened DC into AC at a variable frequency through a plurality of switches to control a load; and
a current detection circuit for detecting overcurrent from the smoothened DC supplied from the inverter circuit,
wherein the inverter circuit applies bootstrap power for driving the switches to the current detection circuit to use the bootstrap power as power of the current detection circuit.

2. An inverter apparatus of claim 1, wherein the inverter circuit comprises:
a switching circuit using the bootstrap power as power for turning on gates of the switches; and
an auxiliary circuit for applying the bootstrap power from the switching circuit to the current detection circuit.

3. The inverter apparatus of claim 2, wherein the auxiliary circuit includes a diode and a resistor serially connected to the switching circuit, and a capacitor connected in parallel with the serially connected diode and resistor.

4. The inverter apparatus of claim 1, wherein the current detection circuit detects positive voltage of DC link voltage from the smoothened DC applied to the inverter circuit.

5. An inverter apparatus including a current detection circuit for detecting current from smoothened DC applied to an inverter circuit, the inverter apparatus comprising:
a plurality of switches for converting the smoothened DC into AC at a variable frequency to control a load;
bootstrap power for driving the switches;
a switching circuit using the bootstrap power as power for turning on gates of the switches; and
an auxiliary circuit for applying the bootstrap power from the switching circuit to the current detection circuit.

6. The inverter apparatus of claim 5, wherein the auxiliary circuit includes a diode and a resistor serially connected to the switching circuit, and a capacitor connected in parallel with the serially connected diode and resistor.

7. The inverter apparatus of claim 5, wherein the switching circuit includes a diode and a resistor serially connected to the auxiliary circuit, and a capacitor connected in parallel with the diode and the resistor serially connected to the auxiliary circuit.

8. The inverter apparatus of claim 5, wherein the current detection circuit measures positive voltage of DC link voltage from the smoothened DC applied to the inverter circuit to detect overcurrent.

* * * * *